(12) United States Patent
Finlay et al.

(10) Patent No.: US 10,186,439 B2
(45) Date of Patent: Jan. 22, 2019

(54) SYSTEMS AND METHODS FOR SENSING PROCESS PARAMETERS DURING SEMICONDUCTOR DEVICE FABRICATION

(71) Applicant: GLOBALFOUNDRIES, INC., Grand Cayman (KY)

(72) Inventors: Boyd Finlay, Ballston Lake, NY (US); Mark Reath, Malta, NY (US); Eric Warren, Glenville, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 15/218,241

(22) Filed: Jul. 25, 2016

(65) Prior Publication Data

US 2018/0025929 A1 Jan. 25, 2018

(51) Int. Cl.
*H01L 21/02* (2006.01)
*H01L 21/67* (2006.01)
*G05B 19/418* (2006.01)

(52) U.S. Cl.
CPC ...... *H01L 21/67276* (2013.01); *G05B 19/418* (2013.01); *G05B 2219/45031* (2013.01)

(58) Field of Classification Search
CPC .......................... H01L 21/67276; H01L 21/02
USPC .......................................... 700/110, 121, 108
See application file for complete search history.

(56) References Cited

U.S. PATENT DOCUMENTS

| 5,774,358 A | * | 6/1998 | Shrote | G06F 17/5022 700/86 |
| 2005/0256601 A1 | * | 11/2005 | Lee | G05B 19/4184 700/108 |
| 2011/0035043 A1 | * | 2/2011 | Liu | H01L 21/67253 700/110 |
| 2016/0094936 A1 | * | 3/2016 | Yang | H04Q 9/00 455/456.1 |

* cited by examiner

*Primary Examiner* — Moin Rahman
(74) *Attorney, Agent, or Firm* — Lorenz & Kopf, LLP

(57) ABSTRACT

Semiconductor device fabrication systems and methods are provided. In an example, a semiconductor device fabrication system includes a semiconductor fabrication tool. Further, the semiconductor device fabrication system includes wireless sensors associated with the semiconductor fabrication tool. The wireless sensors measure process parameters of the fabrication tool and transmit wireless signals. The semiconductor device fabrication system also includes a sensor controller configured to identify the wireless sensors associated with the semiconductor fabrication tool and to receive the wireless signals from the wireless sensors. The semiconductor device fabrication system further includes a tool controller including a receiver for receiving data from the sensor controller. The tool controller is configured to sequentially assign system variable identifiers (SVID) to the data from the sensor controller, and to contextualize the data in data packets.

7 Claims, 2 Drawing Sheets

SYSTEMS AND METHODS FOR SENSING PROCESS PARAMETERS DURING SEMICONDUCTOR DEVICE FABRICATION

TECHNICAL FIELD

The technical field generally relates to systems and method for fabricating semiconductor devices, and more particularly relates to diagnostic sensing of process parameters of semiconductor fabrication tools during fabrication processing.

BACKGROUND

Semiconductor device fabrication requires a plurality of fabrication tools. These fabrication tools are provided with standard input/output (I/O) interfaces and communication ports. These standard I/O interfaces and communication ports typically provide generic interfacing and communication capabilities and may only allow for specific types of data to be collected. However, during semiconductor fabrication, it may be desirable to collect types of data that are not offered by the standard I/O interfaces and communication ports. As a result, many critical fabrication parameters are seldom monitored, leading to non-optimal performance at best and failures of the fabrication tools or wafers at worst.

In addition, wired cables have traditionally been used to transfer data in and out of the I/O interfaces and communication ports. If a user decides to alter the method of data gathering, the wired cables need to be physically re-routed and re-coupled, which increases labor and material costs and reduces efficiencies of the fabrication process.

Accordingly, it is desirable to provide improved systems and methods for fabricating semiconductor devices. Further, it is desirable to provide a semiconductor device fabrication system and/or method in which process parameters of a fabrication tool are measured by wireless sensors. Furthermore, other desirable features and characteristics will become apparent from the subsequent detailed description and the appended claims, taken in conjunction with the accompanying drawings and this background.

BRIEF SUMMARY

Semiconductor device fabrication systems and methods are provided. In an example, a semiconductor device fabrication system includes a semiconductor fabrication tool. Further, the semiconductor device fabrication system includes wireless sensors associated with the semiconductor fabrication tool. The wireless sensors measure process parameters of the fabrication tool and transmit wireless signals. The semiconductor device fabrication system also includes a sensor controller configured to identify the wireless sensors associated with the semiconductor fabrication tool and to receive the wireless signals from the wireless sensors. The semiconductor device fabrication system further includes a tool controller including a receiver for receiving data from the sensor controller. The tool controller is configured to sequentially assign system variable identifiers (SVID) to the data from the sensor controller, and to contextualize the data in data packets.

In another exemplary embodiment, a semiconductor device fabrication system is provided and includes a semiconductor fabrication tool having an integrated interface that measures a first process parameter of the fabrication tool. The semiconductor device fabrication system also includes a sensor controller configured to receive and identify a wireless signal associated with the semiconductor fabrication tool. Further, the semiconductor device fabrication system includes a tool controller configured to receive data from the integrated interface and data from the sensor controller, to assign a unique system variable identifier (SVID) to data from the sensor controller, and to contextualize the data in data packets.

In yet another exemplary embodiment, a method for fabricating a semiconductor device is provided. The method includes providing a semiconductor fabrication tool having an integrated interface that measures a first process parameter of the fabrication tool and having a tool controller configured to receive data from the integrated interface. The method also includes mounting a wireless sensor to measure a second process parameter of the fabrication tool. Further, the method includes coupling a sensor controller to the tool controller. The method includes measuring a first semiconductor fabrication process parameter of the semiconductor fabrication tool using the integrated interface of the fabrication tool and communicating a first signal from the integrated interface to the tool controller. Also, the method includes measuring a second semiconductor fabrication process parameter of the fabrication tool using the wireless sensor that is mounted to the fabrication tool and communicating a second signal from the wireless sensor to the sensor controller. The method further includes transmitting the second signal from the sensor controller to the tool controller. The method includes contextualizing data from the first signal and data from the second signal in the tool controller.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
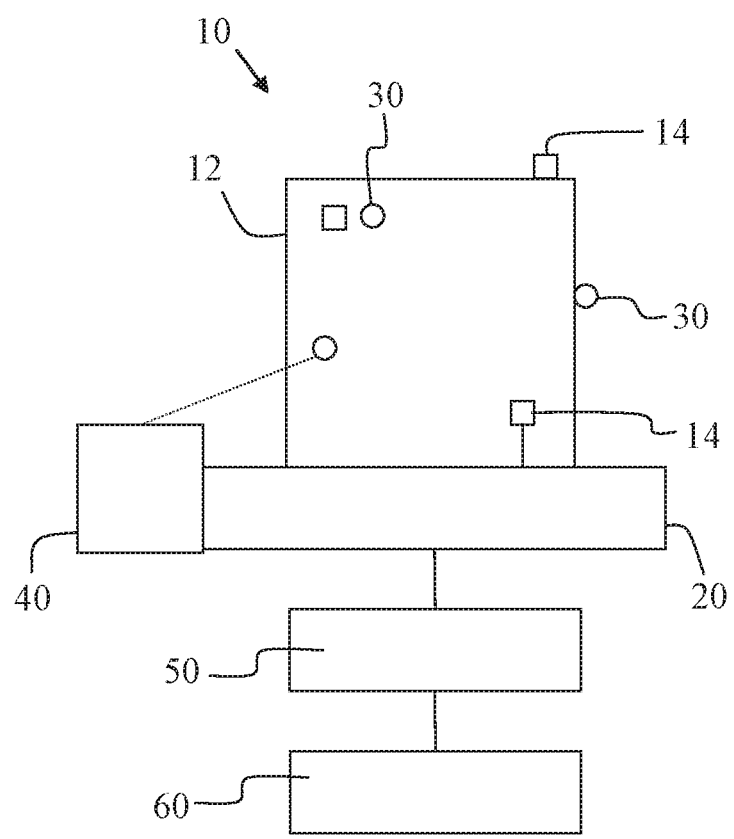
FIG. 1 is a schematic view of a semiconductor device fabrication system according to an embodiment herein.

The following detailed description is merely exemplary in nature and is not intended to limit the semiconductor device fabrication systems and methods. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in the fabrication of semiconductor devices are well-known and so, in the interest of brevity, many conventional steps will only be mentioned briefly herein or will be omitted entirely without providing the well-known process details. Further, it is noted that semiconductor device fabrication systems include a varying number of components and that single components shown in the illustrations may be representative of multiple components.

As described herein, an exemplary semiconductor device fabrication system is provided with a conventional semiconductor fabrication tool that includes integrated sensors or interfaces and a tool controller that communicates with the integrated sensors and that controls operation processes of various parts of the semiconductor fabrication tool.

Conventionally, wired sensors may be added to locations in and around the semiconductor fabrication tool to increase the sensing capability of the semiconductor fabrication tool. Such wired sensors must be integrated into the tool controller via wired connections. During connection of the wired sensors with the tool controller, a user must assign a system variable identifier (SVID) to each wired sensor to identify data received from the sensor during operation. Optimization of a semiconductor fabrication tool may include the additional of tens of wired sensors, and extensive labor related to layout planning and the physical connection of wired sensors to the tool controller. For continuous improvement sensing, such labor often takes six months to complete.

The system and method described herein reduce the labor involved in the addition of sensing capability to less than one day. Specifically, the system and method described herein provides for the use of wireless, remote sensors that may be located at desired positions in and around the semiconductor fabrication tool. Further, the system and method described herein couple a sensor controller to the tool controller. An exemplary sensor controller automatically recognizes and identifies each wireless sensor added to the semiconductor fabrication tool. During operation of the semiconductor fabrication tool, signals from the wireless sensors are communicated directly to the sensor controller. The sensor controller receives the wireless sensor signals and communicates the wireless sensor signals directly to the tool controller.

At the tool controller, data from the wireless sensor signals and data from wired sensors is contextualized. As used herein, "contextualizing" data includes associating the measured process parameter with the tool recipe and recipe stage occurring when the measurement or measured value was taken. Therefore, multiple signals including measurements or measured values from multiple sensors, including wireless sensors or wireless and wired sensors, are associated or tied to a particular stage of processing. Contextualized data from a plurality of sensors may be packaged together in a data packet. In this manner, context of data is provided during later diagnostic analysis of the fabrication tool.

FIG. 1 provides a schematic view of an exemplary semiconductor device fabrication system 10. As shown, the system 10 includes a semiconductor fabrication tool 12. Typically, a semiconductor device fabrication system 10 will include a plurality of semiconductor fabrication tools 12 that are involved in the fabrication of a semiconductor device. In an exemplary embodiment, the semiconductor fabrication tool 12 is a process tool or metrology tool. For example, the semiconductor fabrication tool 12 may perform wet cleans; wet etching; dry etching; photolithography; thermal treatments such as anneals or thermal oxidation; deposition; chemical mechanical planarization; wafer testing; wafer transport; wafer grinding; die preparation such as wafer mounting or die cutting; integrated circuit packaging such as die attachment, bonding, or encapsulation; or integrated circuit testing.

The exemplary semiconductor fabrication tool 12 includes integrated wired interfaces or sensors 14 fixed at selected locations in and around the semiconductor fabrication tool 12. Such integrated sensors 14 are typically installed during manufacture of the semiconductor fabrication tool 12. Exemplary integrated sensors 14 collect fabrication process parameters, i.e., fabrication data. Fabrication process parameters may include any desired measurement of conditions in or around the semiconductor fabrication tool 12, including regarding operational components thereof or on or around the processed wafer or integrated circuit therein. For example, a process parameter may include temperature; pressure; environmental composition; flow mass rate; vibration frequency or amplitude; acceleration; velocity; thickness, height, width, depth or other dimensions; electrical current or voltage; dopant ion concentration, implant angle, or energy; rate of change of such parameters; or other properties.

As shown, the exemplary semiconductor fabrication tool 12 further includes a tool controller 20. The tool controller 20 is configured to control operation processes of various parts of the semiconductor fabrication tool 12. To do so, the tool controller 20 may include a memory or access to a memory in which recipes, i.e., instructions for semiconductor device fabrication are stored. The tool controller 20 is configured to read such recipes and to direct the semiconductor fabrication tool 12 to perform recipe processes. Further, the tool controller 20 is directly connected to the integrated sensors 14 to receive the measured process parameter data from the integrated sensors 14.

In FIG. 1, the exemplary semiconductor device fabrication system 10 also includes remote wireless sensors 30 associated with the semiconductor fabrication tool 12. The remote wireless sensors 30 may be located in or around the exemplary semiconductor fabrication tool 12. For example, the remote wireless sensors 30 may be located within a chamber or chambers in the semiconductor fabrication tool 12, on components of the semiconductor fabrication tool 12, at entrance or exit ports of the semiconductor fabrication tool 12, or at other locations as desired.

Exemplary wireless sensors 30 may be structurally the same or similar to the integrated sensors 14, except that the wireless sensors 30 are not directly electronically connected for wired communication within the semiconductor device fabrication system 10. Accordingly, the wireless sensors 30 may measure fabrication process parameters such as temperature; pressure; environmental composition; flow mass rate; vibration frequency or amplitude; acceleration; velocity; thickness, height, width, depth or other dimensions; electrical current or voltage; dopant ion concentration, implant angle, or energy; rate of change of such parameters; or other properties as desired. Unlike the integrated sensors 14, the wireless sensors 30 include a transmitter for emitting a signal including the measured fabrication process parameter data. For example, the transmitter may transmit a radiofrequency (RF) signal, an infrared (IR) signal, or use other technology enabling short-range wireless interconnection suitable for the specific semiconductor fabrication tool 12 or environment where the wireless sensor 30 is deployed. In practice, wireless sensors 30 may be any suitable low cost, off-the-shelf sensors available for use.

As shown, the exemplary semiconductor device fabrication system 10 also includes a sensor controller 40. The sensor controller 40 is configured to identify signals from the wireless sensors 30. Specifically, the sensor controller 40 includes a signal receiver or transceiver for receiving signals from wireless sensors 30. Upon installation of a wireless sensor 30 and emission of a signal therefrom, the sensor controller 40 automatically recognizes and identifies the emitted signal.

Further, the sensor controller 40 is coupled to the tool controller 20. For example, the sensor controller 40 may include a data sender or transmitter that is directly electronically connected to the tool controller 20 through a wired connection to an input/output interface on the tool controller 20. Alternatively, the sensor controller 40 may include a wireless data sender or transmitter and the tool controller 20 may be provided with a receiver for wirelessly receiving data from the sensor controller 40. As a result, in either embodiment the sensor controller 40 is capable of communicating signal data received from wireless sensors 30 directly to the tool controller 20. Due to the communication from the sensor controller 40 to the tool controller 20, each newly installed wireless sensor 30 need not be coupled to the tool controller 20. Rather, signals from the newly installed wireless sensor 30 are automatically identified and received by the sensor controller 40 and are communicated to the tool controller 20 without any dedicated input/output interface between the newly installed wireless sensor 30 and the tool controller 20. This electronic arrangement obviates a time-consuming effort to electronically connect to the tool controller 20 any wireless sensor 30 added to a semiconductor fabrication tool 12.

Further, the tool controller 20 is configured to sequentially assign an identifier to any measured fabrication process parameter data received by the sensor controller 40 and communicated to the tool controller. For example, the tool controller 20 may sequentially assign a system variable identifier (SVID) to the measured fabrication process parameter data when received. Further, the tool controller 20 assigns a different system variable identifier to measured fabrication process parameter data received from different wireless sensors 30. Also, the tool controller 20 may associate or link the measured fabrication process parameter data to the time when received by the tool controller 20.

Also, the tool controller 20 is configured to contextualize the fabrication process parameter data received from wired sensors 14 or from the wireless sensors 30 via the sensor controller 40. For example, the received fabrication process parameter data is associated with the location of the source sensor 14 or 30 and the time of the measurement, relative to fabrication processing. Specifically, the received fabrication process parameter data is associated with the recipe being worked on by the semiconductor fabrication tool 12 as well as the specific recipe process step occurring at the time the measurement was taken. Further, data or components of data received from more than one wireless sensor 30 from a same measurement time may be associated together for contextualization. Contextualized data may then be packaged in data packets by the tool controller 20. In certain embodiments, the tool controller 20 may perform an analysis on measured values of the process parameters and generate a control signal in response to the analysis. The control signal may be communicated to the semiconductor fabrication tool 12 and include instructions to adjust a fabrication operation.

In FIG. 1, the exemplary semiconductor device fabrication system 10 further includes a common equipment interface (CEI) 50. As shown, the common equipment interface 50 is directly electronically coupled to the tool controller 20 for communication with the tool controller 20. Typically, the common equipment interface 50 will be configured for communication with each semiconductor fabrication tool 12 through the respective tool controller 20 in a region of the fabrication foundry. In an exemplary embodiment, the data packets holding the contextualized data are communicated from the tool controller 20 to the common equipment interface 50. The common equipment interface 50 is configured to compile or prepare metadata, i.e., data about the data contained in the data packets, that may be used for analysis of semiconductor fabrication tool operation or health. An exemplary common equipment interface 50 communicates according to the SEMI Equipment Data Acquisition (EDA) protocol "Interface A".

In FIG. 1, the exemplary semiconductor device fabrication system 10 also includes a system wide centralized infrastructure server 60. The centralized infrastructure server 60 may receive data, including the data packets, from the common equipment interfaces 50 throughout the semiconductor fabrication foundry and process and analyze the data to diagnose errors or non-optimal operations or wafer handling. Depending on the analysis results, the centralized infrastructure server 60 may communicate directions back to a selected individual semiconductor fabrication tool 12 through the associated tool controller 20 and common equipment interface 50. The semiconductor fabrication tool 12 then adjusts operation accordingly.

The exemplary semiconductor device fabrication system 10 described in FIG. 1 allows for immediate integration of wireless sensors 30 into a semiconductor fabrication tool 12. Rather than requiring individual connection between a newly installed wireless sensor 30 and the tool controller 20, the sensor controller 40 automatically receives and identifies any wireless signal sent from the newly installed wireless sensor 30 (provided such wireless sensor 30 is within communication range of the sensor controller 40). The sensor controller 40 is connected for communication with the tool controller 20. Thus, communication is established between each wireless sensor 30 and the tool controller 20.

Figure 2:
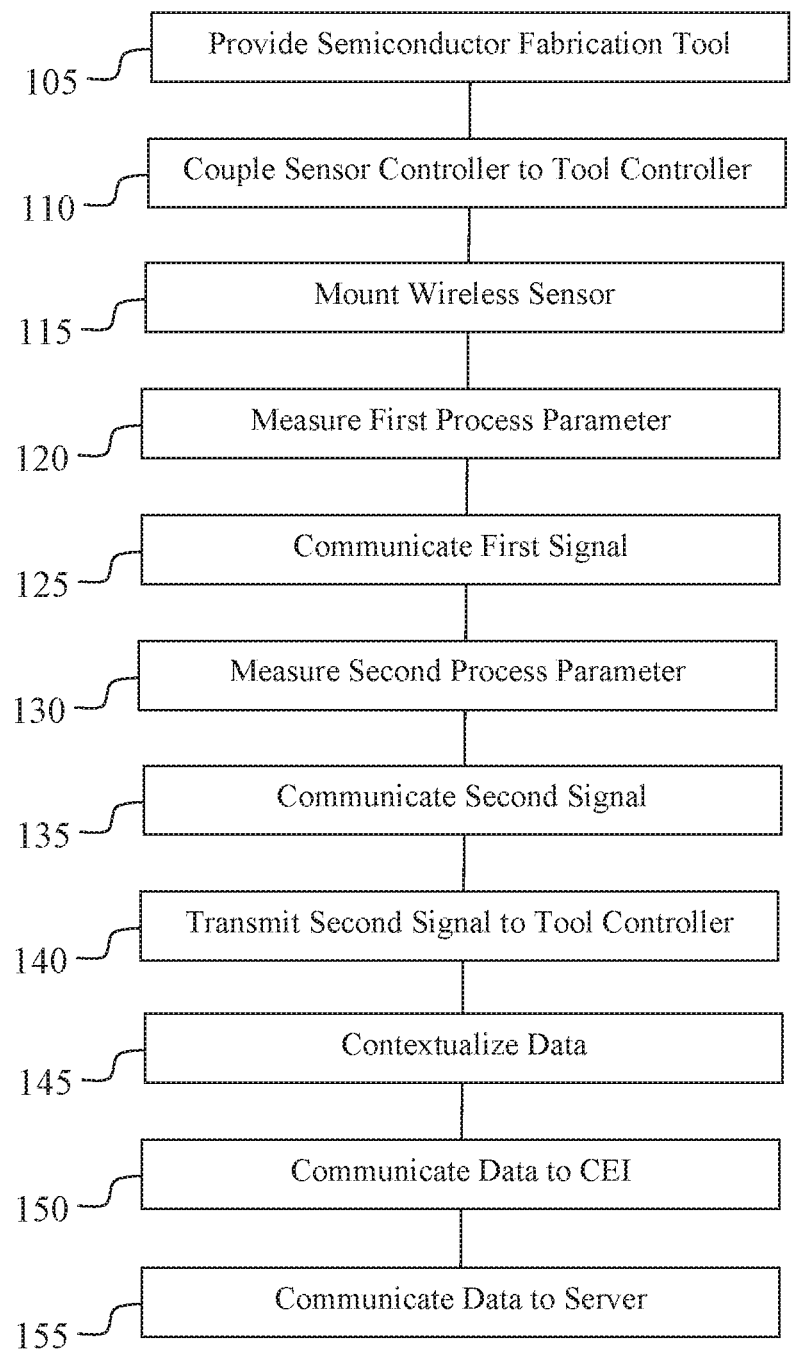
FIG. 2 is a flow chart illustrating processes of a semiconductor device fabrication method according to an embodiment herein.

Referring now to FIG. 2, processes in an exemplary method 100 for fabricating semiconductor devices, such as with the system 10 of FIG. 1, are described. As shown, a semiconductor fabrication tool is provided at action block 105. The semiconductor fabrication tool includes an integrated interface that measures a first process parameter of the fabrication tool and has a tool controller configured to receive data from the integrated interface. The method 100 further includes coupling a sensor controller to the tool controller at action block 110. The sensor controller includes a receiver for receiving wireless signals. Further, the sensor controller includes a transmitter, whether wired or wireless, for communicated signals to the tool controller.

At action block 115, the method 100 includes mounting a wireless sensor at a selected location in or around the semiconductor fabrication tool. The wireless sensor is provided to measure a second process parameter of the fabrication tool. In an exemplary embodiment, the second process parameter is different from the first process parameter. For example, the second process parameter may be a same condition as the first process parameter but at a different location. Alternatively, the second process parameter may be a different condition from the first process parameter and measured at a same location. Of course, the second process parameter may be a different condition from the first process parameter and measured at a different location.

At action block 120, the method includes measuring a first semiconductor fabrication process parameter of the semiconductor fabrication tool using the integrated interface of the fabrication tool. At action block 125, the method includes communicating a first signal from the integrated interface to the tool controller. The first signal includes the measured first semiconductor fabrication process parameter.

At action block 130, the method includes measuring the second semiconductor fabrication process parameter of the fabrication tool using the wireless sensor that is mounted to the fabrication tool. At action block 135, the method includes communicating a second signal from the wireless sensor to the sensor controller. The second signal includes the measured second semiconductor fabrication process parameter.

The method 100 continues at action block 140 where the second signal is transmitted from the sensor controller to the tool controller. Then, at action block 145, the tool controller contextualizes data from the first signal and data from the second signal. In doing so, the tool controller may create a data packet including the contextualized data from one or more signals.

At action block 150, data (including data packets with contextualized data) is communicated from the tool controller to a common equipment interface. The common equipment interface may analyze data received and create metadata thereof. Further, at action block 155 the common equipment interface communicates data to a centralized infrastructure server where control of operations of and logistics between semiconductor fabrication tools is optimized.

In FIG. 2, a method for fabricating semiconductor devices provides for integration of wireless sensors into a semiconductor fabrication tool. The wireless controller coupled to the tool controller of the semiconductor fabrication tool automatically receives any wireless signal emitted within range of the wireless controller and communicates the data contained therein to the tool controller. The tool controller assigns a system variable identifier to data received from the wireless controller. Further, the tool controller contextualizes data received from both the integrated sensors and the wireless sensors to facilitate analysis of the data by the centralized infrastructure server.

As described herein, semiconductor device fabrication systems and methods are provided and facilitate the addition of wireless sensors to semiconductor fabrication tools. As a result, continuous improvement process (CIP) sensing may be performed at the tool level. For example, over one hundred wireless sensors may be installed in or around a semiconductor fabrication tool. As provided herein, communication of the wireless sensors to the tool controller is provided automatically through the sensor controller. Thus, installation time of wireless sensors is greatly reduced, such as from up to six months to less than one day.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A semiconductor device fabrication system comprising:
a semiconductor fabrication tool;
integrated sensors fixed in and/or around the semiconductor fabrication tool and configured to measure selected process parameters of the semiconductor fabrication tool and to transmit selected signals;
wireless sensors associated with the semiconductor fabrication tool, wherein the wireless sensors measure desired process parameters of the semiconductor fabrication tool, and wherein the wireless sensors transmit wireless signals;
a contextualizer configured to identify the wireless sensors associated with the semiconductor fabrication tool, to receive the wireless signals from the wireless sensors, and to contextualize the wireless signals to form data; a sensor controller configured to receive selected signals from the integrated sensors and to create data; and
a tool controller including a receiver for receiving the data from the contextualizer and the data from the sensor controller, wherein the tool controller is configured to sequentially assign system variable identifiers (SVID) to the data, and to further contextualize the data in data packets, wherein, to further contextualize the data, the tool controller is configured to perform an analysis on measured values of the process parameters and to generate a control signal in response to the analysis, the control signal instructing the semiconductor fabrication tool to adjust a fabrication operation.

2. The semiconductor device fabrication system of claim 1 wherein the tool controller is configured to control operation processes of parts of the semiconductor fabrication tool.

3. The semiconductor device fabrication system of claim 1 wherein the tool controller is configured to assign a same system variable identifier (SVID) to data from a same wireless sensor.

4. The semiconductor device fabrication system of claim 1 further comprising a control equipment interface coupled to the tool controller to receive the data packets from the tool controller and to compile metadata related to semiconductor fabrication tool performance.

5. The semiconductor device fabrication system of claim 4 further comprising a centralized server coupled to the control equipment interface to diagnose fabrication errors.

6. The semiconductor device fabrication system of claim 1 wherein the selected process parameters of the semiconductor fabrication tool are different from the desired process parameters measured by the wireless sensors.

7. The semiconductor device fabrication system of claim 1 wherein a first integrated sensor measures a first process parameter of the semiconductor fabrication tool at a first location and wherein a first wireless sensor measures the first process parameter at a second location different from the first location.

* * * * *